(12) United States Patent
Graham et al.

(10) Patent No.: US 11,330,729 B2
(45) Date of Patent: May 10, 2022

(54) SYSTEM AND METHOD FOR RAPIDLY CHANGING AN ACCESSORY FOR AN AMUSEMENT ATTRACTION

(71) Applicant: Universal City Studios LLC, Universal City, CA (US)

(72) Inventors: Martin Evan Graham, Clermont, FL (US); Patrick John Goergen, Orlando, FL (US); Tomas Manuel Trujillo, Miami Springs, FL (US)

(73) Assignee: UNIVERSAL CITY STUDIOS LLC, Universal City, CA (US)

( * ) Notice: Subject to any disclaimer, the term of this patent is extended or adjusted under 35 U.S.C. 154(b) by 203 days.

(21) Appl. No.: 16/580,537

(22) Filed: Sep. 24, 2019

(65) Prior Publication Data
US 2020/0383221 A1 Dec. 3, 2020

Related U.S. Application Data

(60) Provisional application No. 62/854,376, filed on May 30, 2019.

(51) Int. Cl.
*H05K 5/00* (2006.01)
*H05K 5/02* (2006.01)
(Continued)

(52) U.S. Cl.
CPC ......... *H05K 5/0247* (2013.01); *H01R 12/515* (2013.01); *H01R 12/52* (2013.01); *A63G 31/02* (2013.01)

(58) Field of Classification Search
CPC .... H05K 5/0247; H01R 12/515; H01R 12/52; A63G 31/02
See application file for complete search history.

(56) References Cited

U.S. PATENT DOCUMENTS 6,492,590 B1 * 12/2002 Cheng .................... H01F 27/04
174/50
7,097,474 B1 * 8/2006 Naylor ............... H01R 13/6397
174/67

(Continued)

FOREIGN PATENT DOCUMENTS

GB      1388275 A      3/1975
GB      1457894 A      12/1976

OTHER PUBLICATIONS

Hubbell*Wiring Device-Kellems, Safety Product Guide; www.hubbell.com; WLBVMO27 6/18; 24 pages.

(Continued)

*Primary Examiner* — Pete T Lee
(74) *Attorney, Agent, or Firm* — Fletcher Yoder, P.C.

(57) ABSTRACT

A quick disconnect system for an accessory electrically coupled to a component of an amusement attraction includes a multi-part electrical enclosure including a first side, a second side opposite the first side, a first opening on the first side, and a relief pass through. The multi-part electrical enclosure is configured to: have a first electrical cable coupled to the accessory pass into the multi-part electrical enclosure via the first opening and have a second electrical cable pass into the second side of the multi-part electrical enclosure to enable the first and second cables to be coupled together within the multi-part electrical enclosure. The relief pass through is configured to provide strain relief to both the first electrical cable and the second electrical cable and to prevent disconnection of the accessory from the multi-part electrical enclosure.

15 Claims, 11 Drawing Sheets

(51) Int. Cl.
   *H01R 12/51* (2011.01)
   *H01R 12/52* (2011.01)
   *A63G 31/02* (2006.01)

(56) References Cited

U.S. PATENT DOCUMENTS

| | | |
|---|---|---|
| 9,016,627 B2 | 4/2015 | Margis et al. |
| 9,537,295 B2 * | 1/2017 | Dinh .................. H02G 3/185 |
| 9,718,405 B1 | 8/2017 | Englander et al. |
| 10,008,352 B2 | 6/2018 | Hughes |
| 2002/0179315 A1 * | 12/2002 | Brown .................. H02G 3/088 |
| | | 174/50 |
| 2018/0284881 A1 | 10/2018 | Briggs et al. |

OTHER PUBLICATIONS

International Search Report/Written Opinion; PCT/US2020/034541 dated Sep. 2, 2020; 17 pages.

\* cited by examiner

SYSTEM AND METHOD FOR RAPIDLY CHANGING AN ACCESSORY FOR AN AMUSEMENT ATTRACTION

CROSS REFERENCE TO RELATED APPLICATIONS

This application claims priority to and the benefit of U.S. Provisional Patent Application No. 62/854,376, entitled "SYSTEM AND METHOD FOR RAPIDLY CHANGING AN ACCESSORY FOR AN AMUSEMENT ATTRACTION," filed May 30, 2019, which is hereby incorporated by reference in its entirety for all purposes.

BACKGROUND

The present disclosure relates generally to the field of amusement attractions. More specifically, embodiments of the present disclosure relate to the rapid changing of an accessory coupled to a component of an amusement attraction.

This section is intended to introduce the reader to various aspects of art that may be related to various aspects of the present disclosure, which are described below. This discussion is believed to be helpful in providing the reader with background information to facilitate a better understanding of the various aspects of the present disclosure. Accordingly, it should be understood that these statements are to be read in this light, and not as admissions of prior art.

Amusement parks contain a variety of attractions providing unique experiences to each park guest. These attractions may include rides or guest facing areas (e.g., kiosks) where the guests utilize an accessory (e.g., headset, weapon, etc.) electrically coupled to a component of the attraction that enables interaction with the attraction. Occasionally, these accessories may malfunction or break. However, it not desirable to cease or delay the normal operations of the attraction (e.g. ride). Otherwise, the guest experience may be hampered. Thus, there is a need for providing a mechanism for quickly changing out the accessory without ceasing the normal operations of the attraction and hampering the guest experience.

SUMMARY

Certain embodiments commensurate in scope with the originally claimed subject matter are summarized below. These embodiments are not intended to limit the scope of the disclosure, but rather these embodiments are intended only to provide a brief summary of certain disclosed embodiments. Indeed, the present disclosure may encompass a variety of forms that may be similar to or different from the embodiments set forth below.

In an embodiment, a quick disconnect system for an accessory electrically coupled to a component of an amusement attraction is provided. The quick disconnect system includes a multi-part electrical enclosure including a first side, a second side opposite the first side, a first opening on the first side, and a relief pass through. The multi-part electrical enclosure is configured to: have a first electrical cable coupled to the accessory pass into the multi-part electrical enclosure via the first opening and have a second electrical cable pass into the second side of the multi-part electrical enclosure to enable the first and second cables to be coupled together within the multi-part electrical enclosure. The relief pass through is configured to provide strain relief to both the first electrical cable and the second electrical cable and to prevent disconnection of the accessory from the multi-part electrical enclosure.

In an embodiment, a multi-part electrical enclosure for electrically coupling an accessory to an amusement attraction is provided. The multi-part electrical enclosure includes a first enclosure including a back wall, a first wall extending away from the back wall, and a first opening positioned on the back wall configured to receive a first electrical cable. The multi-part electrical enclosure also includes a second enclosure including a second wall coupled to the first enclosure, a lid removably and securely coupled to the second wall, and a second opening defined by both the second wall and the lid. The second opening is configured to receive a second electrical cable coupled to an accessory to enable the first and second cables to be coupled together within the multi-part electrical enclosure. When the lid is coupled to the second wall the second opening is configured to provide a relief pass through that is configured to provide strain relief to the first and second electrical cables prevent the accessory from being disconnected from the multi-part electrical enclosure.

In an embodiment, a method for rapidly changing an accessory on a component of an amusement attraction is provided. The method includes inserting a release tool into a lid of a multi-part electrical enclosure to release one or more locking pins securely coupling the lid to the multi-part electrical enclosure. The multi-part electrical enclosure includes a first electrical cable coupled to the accessory that passes into the multi-part electrical enclosure via a first opening on a first side of the multi-part electrical enclosure and the first electrical cable is coupled together with a second electrical cable passing through a second side of the multi-part electrical enclosure or a wireless adapter within the multi-part electrical enclosure, and wherein the multi-part electrical enclosure includes a relief pass through that provides strain relief to at least the first electrical cable and prevents the accessory from being disconnecting the accessory from the multi-part electrical enclosure. The method also includes removing the lid from the multi-part electrical enclosure. The method further includes disconnecting the first electrical cable coupled to the accessory from the second electrical cable or the wireless adapter.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

One or more specific embodiments of the present disclosure will be described below. In an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Amusement parks feature a wide variety of entertainment, such as amusement park rides, performance shows, and games. Embodiments of the present disclosure are directed to a quick disconnect system that enables an accessory (headset (e.g., for virtual-reality or augmented reality experience), weapon (e.g., gun, crossbow, etc.), or any other user accessory electrically coupled to the attraction) electrically coupled to a component of the amusement attraction to be quickly changed out (e.g., when the accessory is malfunctioning or broken) for another accessory. The quick disconnect system may include a multi-part electrical enclosure (e.g., low voltage electrical enclosure or box). The multi-part electrical enclosure may include an enclosure disposed within the component (e.g., ride vehicle or kiosk) of the amusement attraction that enables one or more electrical cables (e.g., from a power supply, computer, or other equipment) to pass into the multi-part electrical enclosure. The multi-part electrical enclosure may also include another enclosure (e.g., strain relief enclosure) that couples to the enclosure disposed within the component of the amusement attraction. The strain relief enclosure includes a strain relief pass through that an electrical cable coupled to the accessory extends through to enable the electrical cable with the accessory to be coupled to the one or more electrical cables extending from the other enclosure within the component. The strain relief enclosure provides strain relief to the electrical cables within the multi-part electrical enclosure that may withstand a specific pull force from a guest to keep the electrical cables operational. The strain relief enclosure includes a lid (e.g., tamper proof lid) that may be secured via a fastener to limit access to the components within the multi-part electrical enclosure. The lid keeps the guest from tampering with the multi-part electrical enclosure to avoid theft, malicious access to data lines, or creating a flying object that could hurt another guest. In certain embodiments, the fastener includes one or more locking pins. The locking pins may be released via a release tool that enables the lid to be quickly removed (e.g., slid upward and off) from the multi-part electrical enclosure. With the lid removed, the electrical cable coupled to the accessory can be disconnected and another accessory coupled to the one or more electrical cables upon which the lid can be and secured to the multi-part electrical enclosure. This enables the accessory to be quickly changed out (e.g., within 15 to 20 seconds) without interrupting normal operations of the amusement attraction.

Although the quick disconnect system is described below in the context of being utilized with electrical cables, the quick disconnect system may also be utilized with other types of components. For example, the quick disconnect system may be utilized with pneumatic tubes. In other embodiments, the quick disconnect system may be utilized with mechanical cables (e.g., wire cables).

Figure 1:
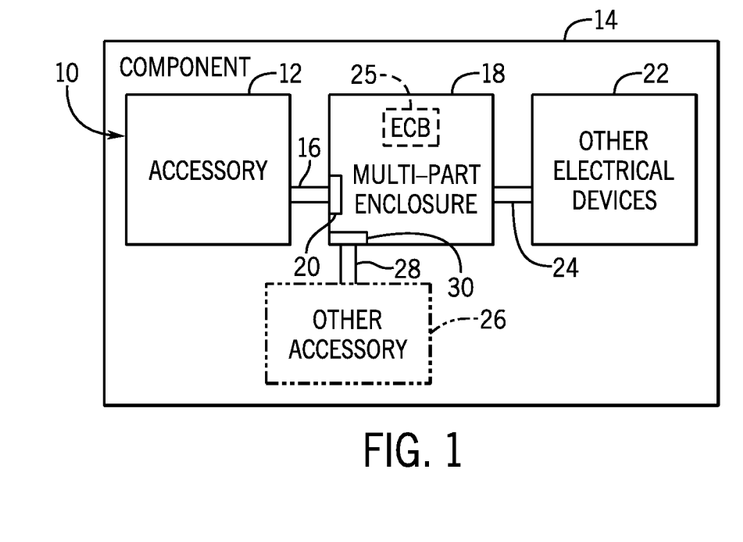
FIG. 1 is a schematic of an embodiment of a quick disconnect system for an accessory coupled to a component of an amusement attraction.

Turning to the figures, FIG. 1 illustrates an embodiment of a quick disconnect system 10 for an accessory 12 coupled to a component 14 of an amusement attraction. The quick disconnect system 10 enables the accessory 12 electrically coupled to the component 14 (e.g., ride vehicle, kiosk, etc.) of the amusement attraction to be quickly changed out (e.g., when the accessory 12 is malfunctioning or broken) for another accessory. The accessory 12 is coupled via an electrical cable 16 to a multi-part electrical enclosure 18 (e.g., low voltage electrical enclosure or box). As will be described in greater detail below, the electrical cable 16 passes through a strain relief pass through 20. In certain embodiments, the enclosure 18 may only include a single strain relief pass through 20. One or more other electrical devices 22 (e.g., power supply, computer, other electrical equipment, etc.) are coupled to the multi-part electrical enclosure 18 via one or more electrical cables 24. The one or more electrical cables 24 pass through an opening into the multi-part electrical enclosure 18. The cables 16, 24 are coupled together within the multi-part electrical enclosure 18. In certain embodiments, the multi-part enclosure 18 may include an electronics circuit board (ECB) 25 of some minimal processing to provide amplified signals or expanded in line capabilities The electronics circuit board 25 may include processing circuitry, memory circuitry, and/or other type of circuitry. The electronics circuit board 25 may be located in a rear enclosure or a strain relief enclosure of the multi-part enclosure 18 described below. The electronics circuit board 25 provides a connection point for the peripheral that could be a significant distance away from a computer (or similar device) where a signal from the computer may have degraded or needs to have a data signal boosted to maintain certifications (HDMI, USB, etc.).

In certain embodiments, an amusement attraction (e.g., ride vehicle of a ride attraction) may be retrofitted with a wireless option for communicating with other electrical devices 22. In certain embodiments, instead of coupling to the electrical cable 24, the electrical cable 18 may be coupled to a wireless adapter within the enclosure 18 (e.g., in the strain relief enclosure) that communicates with the other electrical devices 22.

The single strain relief pass through 20 provides strain relief to both the electrical cable 16 coupled to the accessory 12 and the one or more electrical cables 24 coupled to the electrical cable 16. In certain embodiments, the strain relief portion of the enclosure 18 provides strain relief to the electrical cables 16, 24 within the multi-part electrical enclosure 18 that may withstand a specific pull force from a guest to keep the electrical cables 16, 24. The specific pull force may vary. In certain embodiments, the pull force may be approximately 100 pounds of pull force (e.g., approximately 445 Newtons (N)) or greater. In certain embodiments, the strain relief may resist an even greater pull force to keep the electrical cables 16, 24 from being entirely disconnected from the multi-part electrical enclosure 18. The cables 16, 24 may be flexible to facilitate the strain relief. The cables 16, 24 may also include strain reliefs. For example, the cable 16 may include a strain relief where it couples to the accessory or along another portion of the cable 16. The cable 24 may also include a strain relief where it passes through the multi-part electrical enclosure 18 or along another portion of the cable 24. In addition, the multi-part electrical enclosure 18 may include a lid 50 (e.g., tamper proof lid) securely fastened to the enclosure 18. The lid keeps the guest from tampering with the multi-part electrical enclosure 18 to avoid theft, malicious access to data lines, or creating a flying object that could hurt another guest. As described in greater detail below, the lid may be removed upon unlocking or releasing a fastener securely coupling the lid to the multi-part electrical enclosure 18, and the accessory 12 may be quickly changed out and the lid quickly re-secured to the multi-part electrical enclosure 18 (e.g., between 15 and 20 seconds). In certain embodiments, one or more additional accessories 26 may be coupled to the multi-part electrical enclosure 18 via a respective cable 28 that passes through a respective strain relief pass through 30. In other words, the multi-part electrical enclosure 18 may include more than one strain relief pass through. For example, in certain embodiments, the multi-part electrical enclosure 18 may include 2, 3, 4 or more strain relief pass throughs.

Figure 2:
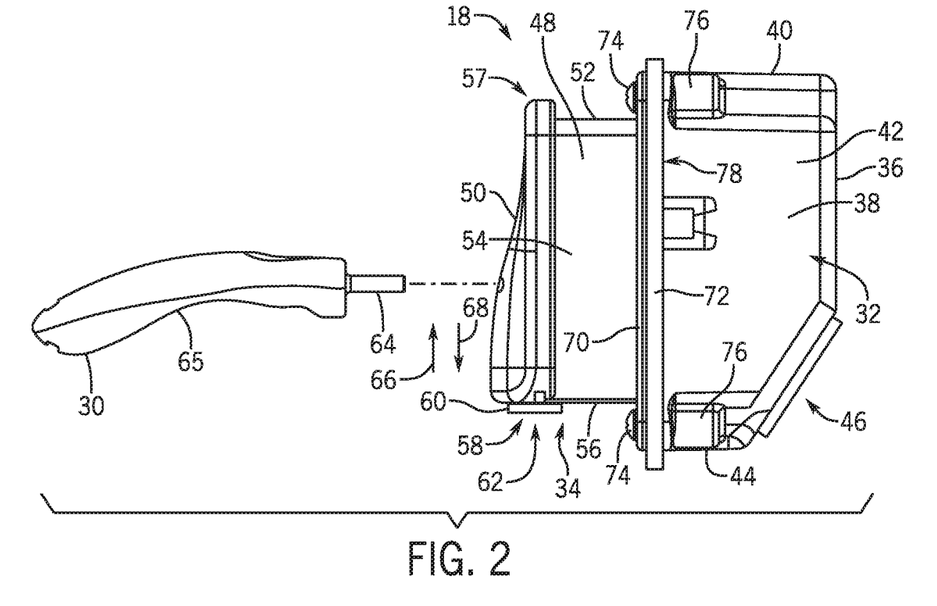
FIG. 2 is a side view of an embodiment of a multi-part electrical enclosure and tool for the quick disconnect system of FIG. 1.

FIG. 2 is a side view of an embodiment of the multi-part electrical enclosure 18 and tool 30 for the quick disconnect system 10 of FIG. 1. The multi-part electrical enclosure 18 includes a first enclosure 32 (e.g., rear enclosure) coupled to a second enclosure 34 (e.g., strain relief enclosure). In certain embodiment, the multi-part electrical enclosure 18 may be made of a fiber reinforced plastic. The first enclosure 32 may be disposed within the component 10 (e.g., ride vehicle, kiosk, etc.). The first enclosure 32 includes a back wall 36 and a wall 38 extending away from the back wall 36. The wall 38 may include a top wall portion 40, a side wall portions 42, and a bottom wall portion 44. The number of wall portions for the wall 38 may vary depending on the shape of the wall 38. In certain embodiments, the wall 38 may define a rectilinear shape, elliptical shape, or any other shape. The back wall 36 includes an opening 46 towards the rear of the first enclosure 32 for receiving the one or more cables from one or more electrical devices 22. As depicted, the opening 46 may be adjacent to the bottom wall portion 44. In certain embodiments, the opening 46 may be located on a different portion of the back wall 36 or one of the other wall portions 40, 42, 44.

The second enclosure (strain relief enclosure) 34 includes a wall 48 and the lid 50 (e.g., tamper proof lid). The strain relief enclosure 34 is located outside the component 14. In certain embodiments, the lid 50 may be themeable. The wall 48 includes a top wall portion 52, side wall portions 54, and a bottom wall portion 56. The number of wall portions for the wall 48 may vary depending on the shape of the wall 48. In certain embodiments, the wall 48 may define a rectilinear shape, elliptical shape, or any other shape. The lid 50 may be coupled to and cover a front 57 of the strain relief enclosure 34 to keep a guest from accessing the components within the multi-part electrical enclosure 18. The shape of the lid 50 may vary from the curved shape depicted in FIG. 2. The wall 48 (e.g., bottom wall portion 56) and the lid 50 together define an opening 58 for a strain relief pass through 60 (e.g., over molding pass through) at an end portion 62 (e.g., bottom portion) of the strain relief enclosure 34. In certain embodiments, the opening 58 (and stain relief pass through) may be located on a top portion of the strain relief enclosure 34. The strain relief pass through 60 receives the cable 16 coupled to the accessory 12. Upon entering the strain relief pass through 60 (and the lid 50 being secured on), the cable 16 is turned at an angle (e.g., towards the first enclosure 32) relative to a direction of insertion of the cable 16 into the strain relief pass through 60. In certain embodiments, the cable 16 may be turned at an angle between approximately 0 and 180 degrees. Although the strain relief enclosure 34 includes a single strain relief pass through 60, in certain embodiments, the strain relief enclosure 34 may include more than one strain relief pass through for receiving another cable of another accessory. The strain relief may be provided by the lid 50 being slid down and secured onto the wall 48. The lid 50 may include a surface or protrusion (e.g., L-shaped surface or other shape) that interfaces with the cable 16 and encourages the turn of the cable 16. The cable 16 may be coupled to one or more cables 24 within the multi-part electrical enclosure 18. The strain relief provided by the strain relief pass through 60 may be provided to both of the cables 16, 24 on both sides of the multi-part electrical enclosure 18. Due to the strain relief, the cables 16, 24 may withstand a significant pull force from the guest as described above.

The lid 50 may be securely fastened to the wall 48 via a fastener. In certain embodiments, the fastener may be a lock that may be unlocked via key. In other embodiments, the fastener may be one or more locking pins. The one or more locking pins may be released by a tool 30 (e.g., release tool) that includes one or more pins 64 (extending from a handle 65) that are inserted into the lid 50 and push on the one or more locking pins to release the lid 50 from the wall 48. Upon unlocking or releasing the lid 50, the lid 50 may be slid upward 66 to remove it from the second enclosure 34. This enables the cable 16 coupled to the accessory 12 to be disconnected from the one or more cables 24 and another accessory to be coupled to the one or more cables 24 via its cable. Upon exchanging accessories, the lid 50 may then be secured in a downward direction 68. In certain embodiments, the lid 50 may be coupled to the wall 48 (a top or side portion of the wall 48) via a hinge, where the lid 50 may be swung open upon unlocking or releasing the lid 50.

The second enclosure 34 includes a first flange 70 (e.g., front aesthetic flange). The wall 48 is coupled to the first flange 70. The second enclosure 34 is coupled to the first enclosure 32 via the first flange 70 and a second flange 72 (e.g., surface conforming flange). A portion of the second flange 72 contacts the wall 38, while another portion of the second flange 72 may contact an outer surface of the component 14. The first enclosure 32 and second enclosure 34 are coupled together via one or more fasteners 74 extending through openings in the first flange 70 and the second flange 72 into respective mounts 76 (e.g., threaded bosses) extending (e.g., rearward) from a front portion 78 of the first enclosure 32. The fasteners may include screws, nuts and bolts, or another type of fastener.

Figure 3:
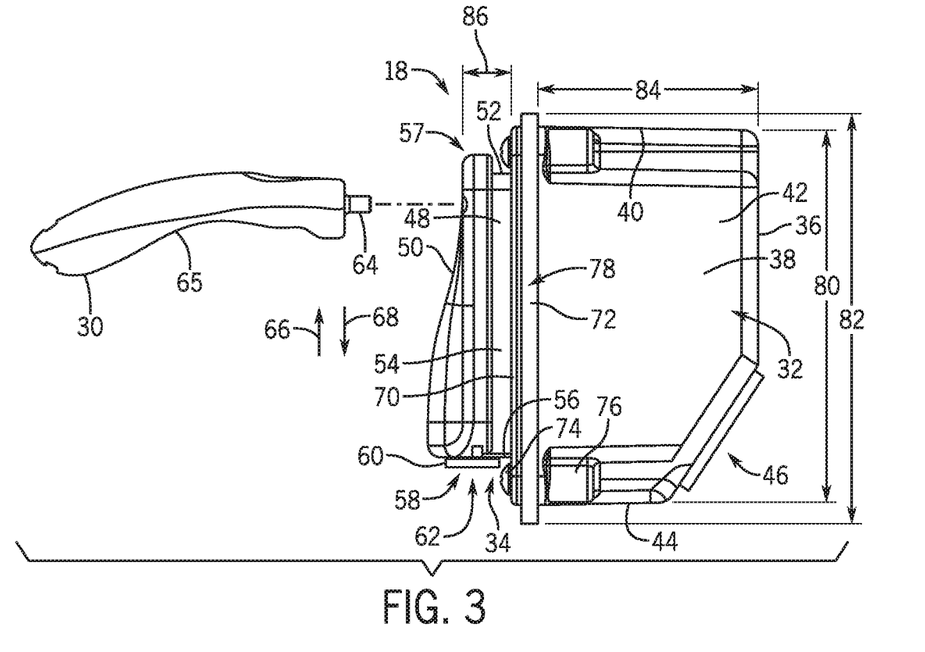
FIG. 3 is a side view of an embodiment of a multi-part electrical enclosure and tool for the quick disconnect system of FIG. 1.

FIG. 3 is an embodiment of the multi-part electrical enclosure 18. The multi-part electrical enclosure 18 in FIG. 3 is similar to the multi-part electrical enclosure 18 in FIG. 2 with a few exceptions. For example, a length 80 of the first flange 70 is shorter than the length 82 of the second flange 72 in FIG. 3 (as opposed to FIG. 2 where the first and second flanges 70, 72 have a same length). In addition, the first flange 70 in FIG. 3 is thicker than the first flange 70 in FIG. 2. Further, the length 82 or depth 84 for the wall 38 is greater in FIG. 3 than in FIG. 2, while the length 82 or depth 86 of the wall 48 in FIG. 3 is less in FIG. 3 than in FIG. 2.

Figure 4:
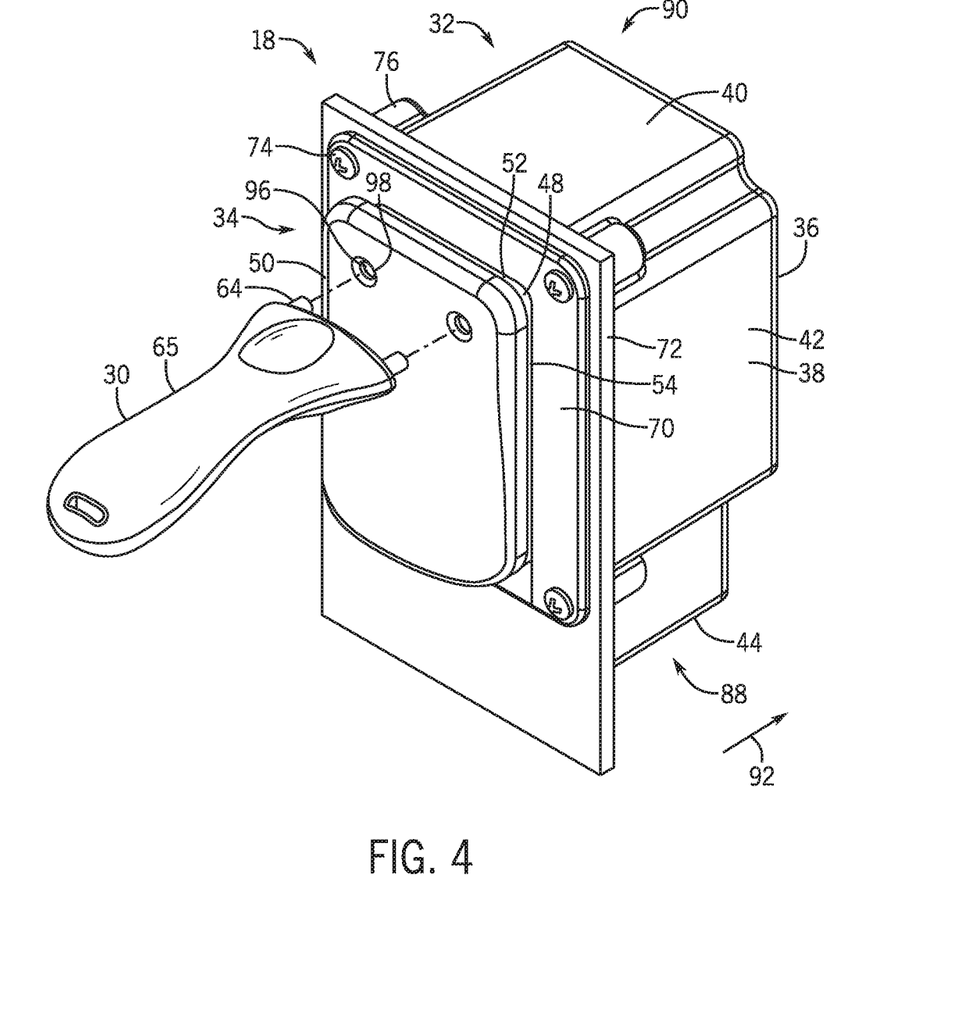
FIG. 4 is a front perspective view of the multi-part electrical enclosure and tool of FIG. 3.
Figure 5:
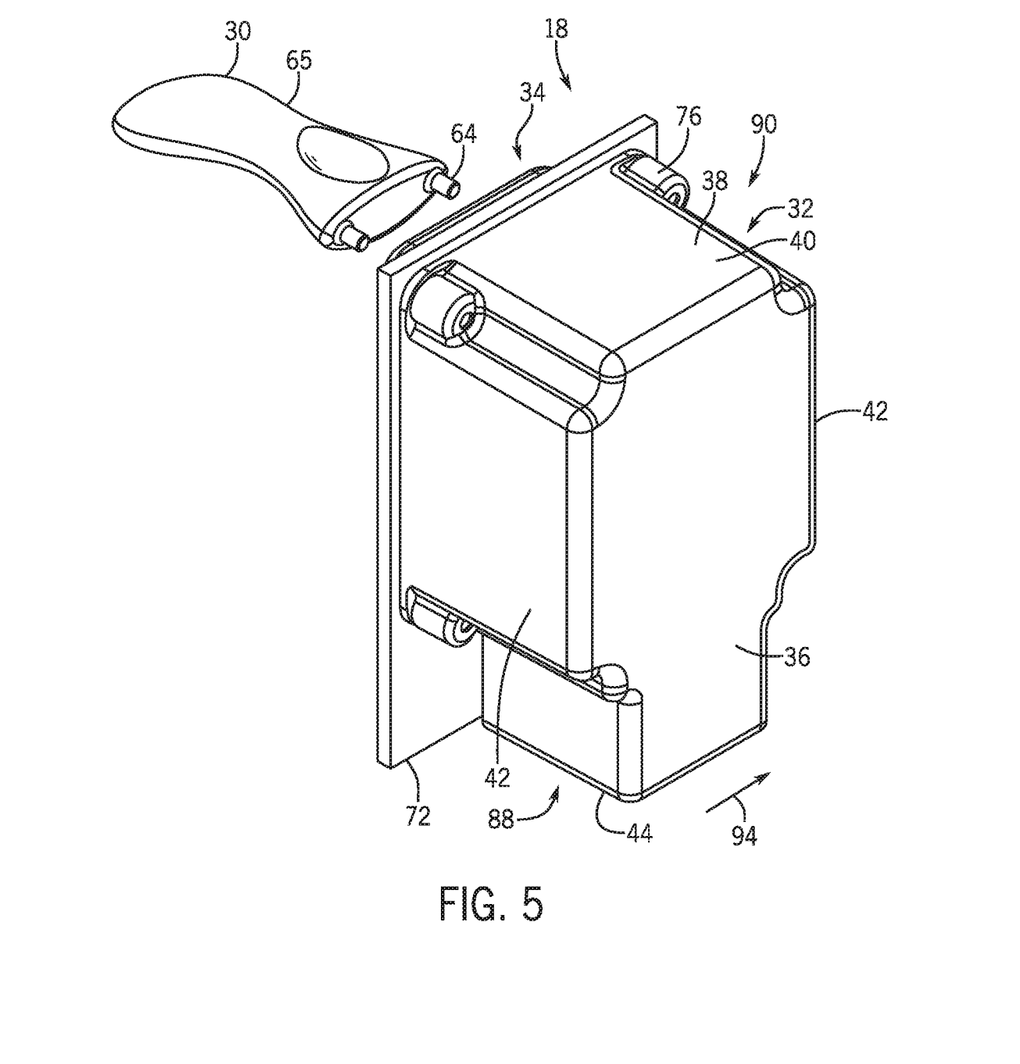
FIG. 5 is a rear perspective view of the multi-part electrical enclosure and tool of FIG. 4.
Figure 6:
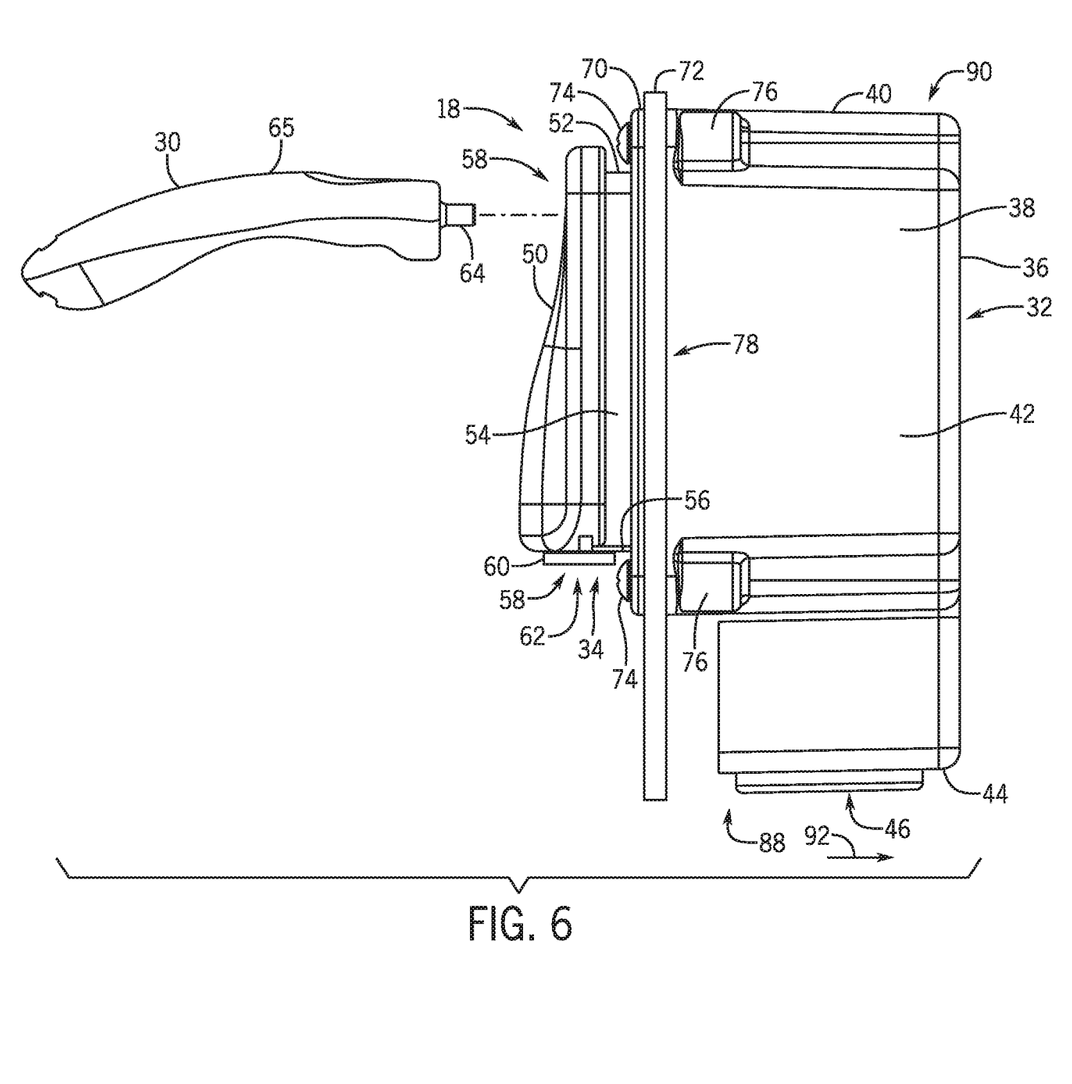
FIG. 6 is a side view of the multi-part electrical enclosure and tool of FIG. 4.

FIGS. 4-6 are different views of an embodiment of the multi-part electrical enclosure 18. The enclosure is similar to the multi-part electrical enclosure 18 in FIGS. 2 and 3 with a few exceptions. For example, a bottom portion 88 of the rear enclosure 32 in FIGS. 4-6 is narrower than an upper portion 90 both in a direction 92 from the front 78 to the back wall 36 of the first enclosure 32, and in a direction 94 between the side portions 42. In addition, the opening 46 for receiving the one or more cables 24 is located on the bottom wall portion 44. As depicted in FIG. 4, the lid 50 includes a plurality of recesses 96 that enable a plurality of locking pins 98 to extend from within the multi-part electrical enclosure 18 to partially within the recesses 96 to secure the lid to the second enclosure 34. As described, the tool 30 may be utilized to insert the respective pins 64 into the respective recesses to push in the respective locking pins 98 to release the locking pins 98 so that the lid 50 may be slid off (e.g., upward) the second enclosure 34. In certain embodiments, the multi-part electrical enclosures 18 described in FIGS. 2-6 may be orientated in the opposite direction when installed, thus, locating the strain relief pass through 60 on the top instead of the bottom.

Figure 7:
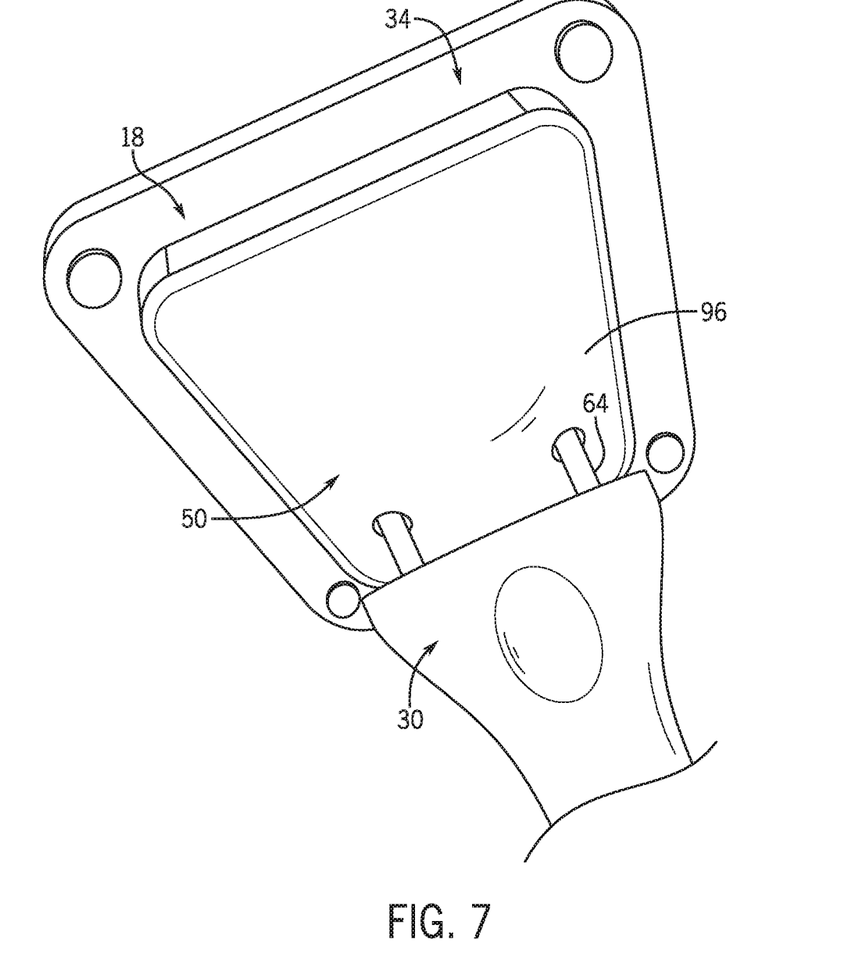
FIG. 7 is a perspective view of a tool being inserted into a lid of a multi-part electrical enclosure coupled to a portion of a component (e.g., ride vehicle) of an amusement attraction.
Figure 8:
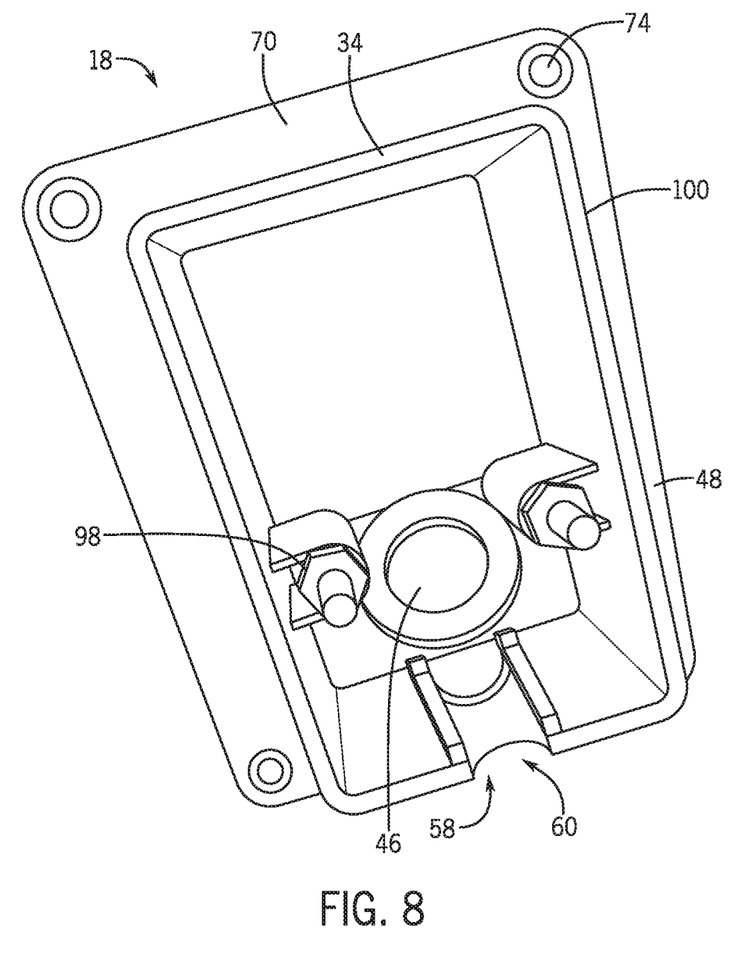
FIG. 8 is a perspective view of the multi-part electrical enclosure of FIG. 7 with the lid removed.

FIG. 7 illustrates the pins 64 of the tool 30 being inserted into the recesses 96 on the lid 50 so that the respective pins 64 may be pushed in to release the locking pins 98 so that the lid 50 may be slide off. FIG. 8 illustrates the multi-part electrical enclosure 18 with the lid 50 removed. As depicted, the locking pins 98 are coupled to an inner surface 100 of the wall 48 (e.g., side wall portions 54) and flank the opening 46. The number and location of locking pins 98 may vary.

Figure 9:
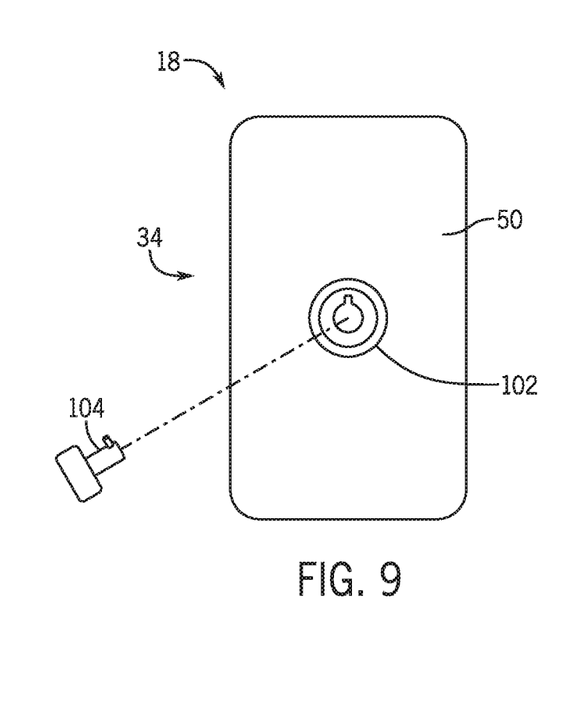
FIG. 9 is a schematic view of an embodiment of a key and a front of a multi-part electrical enclosure with a lid having a lock.

As mentioned above, other mechanisms may be utilized to secure the lid 50 to the multi-part electrical enclosure 18. FIG. 9 depicts the lid 50 having a lock 102. A key 104 may be utilized to unlock the lid 50 so that it can be removed from the multi-part electrical enclosure 18.

Figure 10:
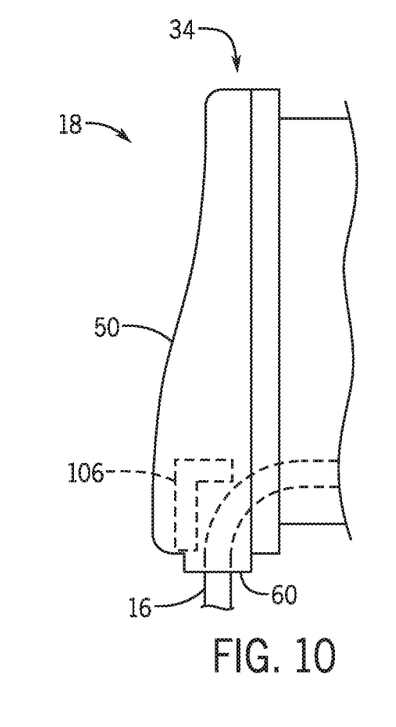
FIG. 10 is a schematic view of an embodiment of the cable within a portion of the multi-part electrical enclosure.

FIG. 10 is a schematic view of an embodiment of the cable 16 within a portion of the multi-part electrical enclosure 18. In particular, an inner portion or surface of the lid 50 includes an L-shaped portion or protrusion 106 that interfaces with the cable 16 and encourages the turn of the cable 16 within the second enclosure 34 when the lid 50 is secure to the second enclosure 34. The turn of the cable 16 may be between approximately 0 to 180 degrees. As depicted, the cable 16 is turned approximately 90 degrees. In certain embodiments, the lid 50 may include a portion that is shaped differently from the L-shaped portion 106 that encourages the turn of the cable 16. For example, the portion on the lid 50 may include a rectilinear shape, curved shape, irregular shape, or any type of shape that encourages the turning of the cable 16.

Figure 11:
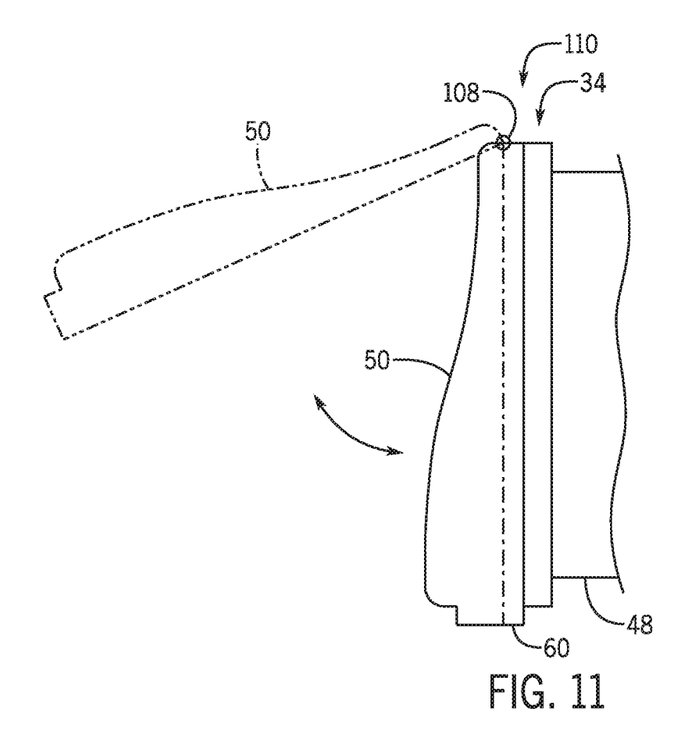
FIG. 11 is a side view of an embodiment of a multi-part electrical enclosure with the lid coupled via a hinge (e.g., with the lid in open and closed positions)

FIG. 11 is a side view of an embodiment of a portion of the multi-part electrical enclosure 18 with the lid 50 coupled, via a hinge 108, with the lid 50 in an open and closed position. As mentioned above, the lid 50 may be coupled to the second enclosure 34 via the hinge 108. As depicted, the hinge 108 is located adjacent to a top portion 110 of the lid 100 and the wall 48. Upon unlocking or releasing the lid 50, the lid 50 may be swung from the closed position to the open position and vice versa. In certain embodiments, the hinge 108 may be located on a side portion at an interface between the lid 50 and wall 48.

Figure 12:
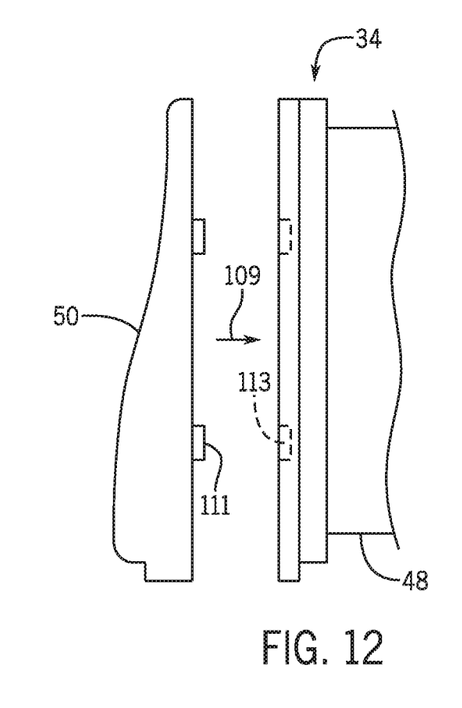
FIG. 12 is a side view of an embodiment of a multi-part electrical enclosure with the lid (e.g., snappable lid) separated from the multi-part electrical enclosure.

FIG. 12 is a side view of an embodiment of the multi-part electrical enclosure 18 with the lid 50 (e.g., snappable lid) separated from the multi-part electrical enclosure 18. As depicted, the lid 50 may be snapped onto to the second enclosure 34 as indicated by the arrow 109. The lid 50 may include protrusions or snaps 111 that configured to be inserted or snapped into receptacles 113 on the second enclosure 34. In certain embodiments, the second enclosure 34 may include the snaps or protrusions and the lid 50 includes the receptacles.

Figure 13:
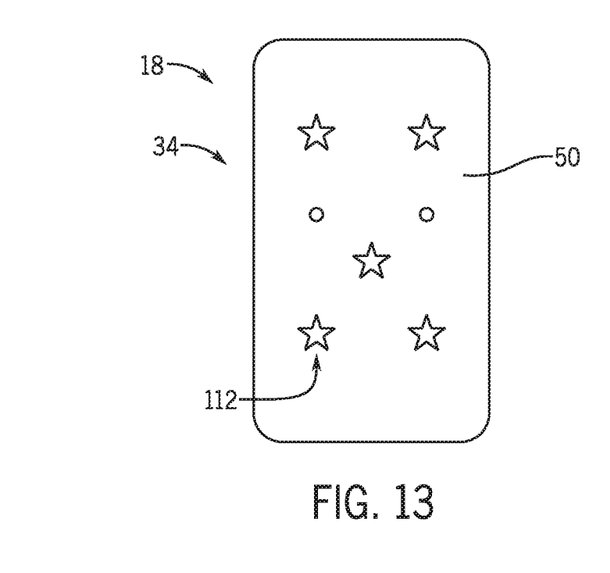
FIG. 13 is a schematic front view of an embodiment of a multi-part electrical enclosure with a lid having a theme.

As mentioned above, the lid 50 of the multi-part electrical enclosure 18 may be themeable. FIG. 13 is a schematic front view of an embodiment of the multi-part electrical enclosure 18 with the lid 50 having a theme 112. The theme 112 may correspond to the attraction. The theme 112 may be achieved via a color, shape, texture, print, or any other characteristic. The lid 50 may be formed (e.g., molded) to include the theme 112. In certain embodiments, the theme 122 may be separately attached or coupled to the lid 112.

Figure 14:
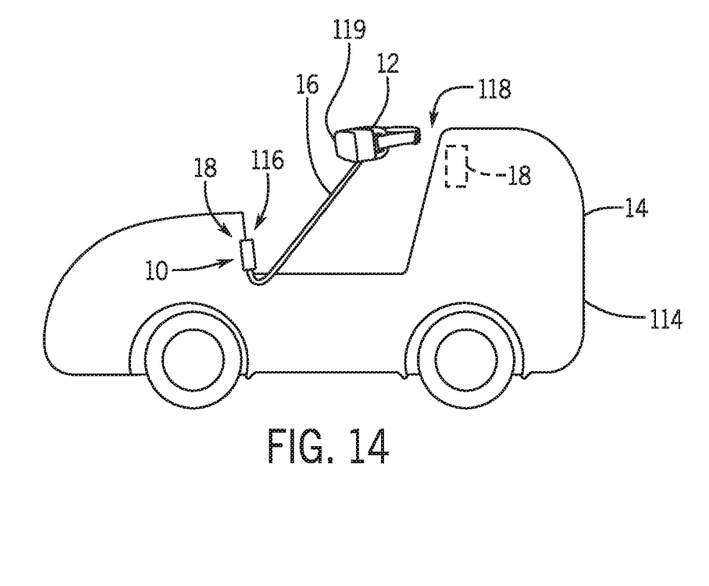
FIG. 14 is a schematic of an embodiment of a ride vehicle having the multi-part electrical enclosure of FIG. 1.

The multi-part electrical enclosure 18 may be coupled to different types of components 14 for an amusement attraction. As depicted in FIG. 14, the multi-part electrical enclosure 18 coupled to the accessory 12 is disposed in a ride vehicle 114. For example, the first enclosure 32 may be disposed within the ride vehicle 114 while the strain relief second enclosure 34 may be disposed on the outside. As depicted, the multi-part electrical enclosure 18 is disposed in a portion of a footwell 116 of the ride vehicle 114. In certain embodiments, the multi-part electrical enclosure 18 may be disposed in a back support region 118 of the ride vehicle 114. The multi-part electrical enclosure 18 may be disposed in other areas of the ride vehicle 114 that enable the user to utilize the accessory 12. As depicted, the accessory 12 is a headset 119 (e.g., for a virtual reality or augmented reality experience). In other embodiments, the accessory 12 may be any other accessory electrically coupled to the ride vehicle 114 that enables the user to interface with the attraction.

Figure 15:
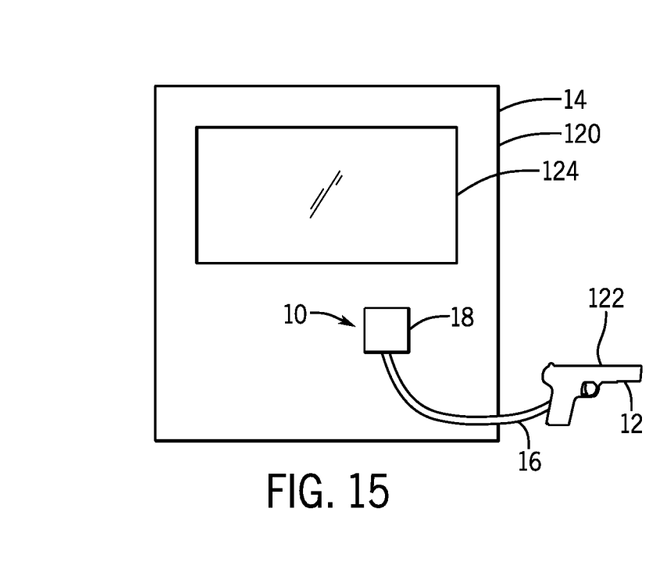
FIG. 15 is a schematic of an embodiment of a ride vehicle having the multi-part electrical enclosure of FIG. 1.

As depicted in FIG. 15, the multi-part electrical enclosure 18 is part of a kiosk 120 or guest facing area. For example, the first enclosure 32 may be disposed within the kiosk 120 while the strain relief enclosure 34 may be disposed on the outside. As depicted, the accessory 12 is a gun 122. As noted above, the accessory 12 may be any other accessory electrically coupled to the kiosk 120 that enables the user to interface with the attraction. For example, the guest may utilize the accessory 12 may utilize the accessory 12 to interface with a guest interface 124 (e.g., screen, animatronic set, etc.).

Figure 16:
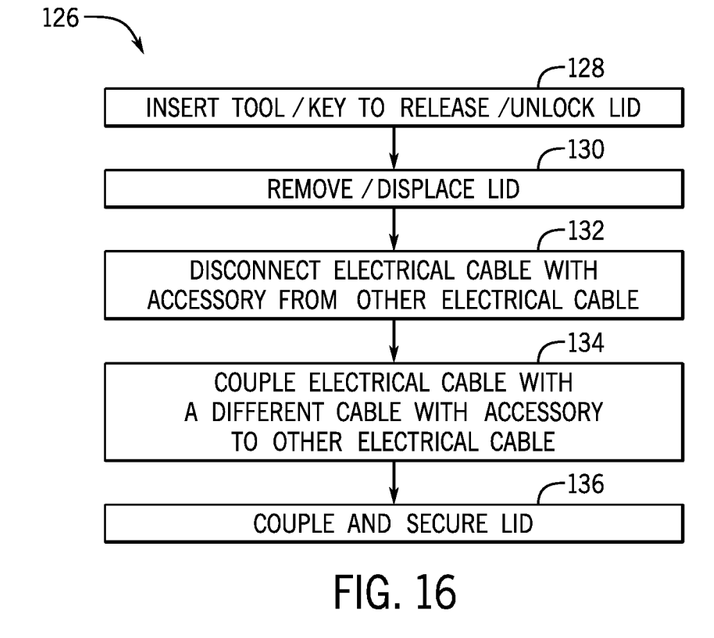
FIG. 16 is flow chart of an embodiment of a method for rapidly changing an accessory on a component of an amusement attraction.

FIG. 16 is a flow chart of an embodiment of a method 126 for rapidly changing the accessory 12 on the component 14 of an amusement attraction. The method 126 includes inserting a tool or key into the lid of a multi-part electrical enclosure, as described above, coupled to an accessory to release or unlock the lid (block 128). For example, a release tool including one or more pins may be inserted into one or more recesses on the lid to push in one or more corresponding locking pins to release the lid. In certain embodiments, the lid may include a lock that is unlocked with the use of a key. The method 126 also includes removing displacing the lid from a strain relief enclosure of the multi-part electrical enclosure to provide access to an interior of the multi-part electrical enclosure (block 130). In certain embodiments, the lid may be slid off in an upward direction to remove the lid from the multi-part electrical enclosure. In other embodiments (e.g., where the lid is coupled via a hinge to the strain relief enclosure), the lid may be displaced (e.g., swung up or sideways) from the multi-part electrical enclosure. The method 126 further includes disconnecting an electrical cable coupled to an accessory (e.g., malfunctioning or broken accessory) from another electrical cable (e.g., coupled to a power supply, computer, or another electrical device within the component of the attraction) within the multi-part electrical enclosure (block 132). As noted above, in certain embodiments the electrical cable coupled to an accessory may be coupled to a wireless adapter within the multi-part enclosure (e.g., in the strain relief enclosure). Thus, the electrical cable coupled to the accessory may be disconnected from the wireless adapter. The method 126 even further includes coupling a different cable coupled to an accessory (e.g., functioning accessory) to the electrical cable (e.g., coupled to the electrical components of the attraction) or wireless adapter within the multi-part electrical enclosure (block 134). The method 126 still further includes coupling and securing the lid back on to the multi-part electrical enclosure to provide strain relief to the electrical cables within the multi-part electrical enclosure (block 136). The method 126 may be performed within seconds (e.g., approximately 15 to 20 seconds) to maintain normal operation of the ride or normal utilization of the guest facing area.

While only certain features of the invention have been illustrated and described herein, many modifications and changes will occur to those skilled in the art. It is, therefore, to be understood that the appended claims are intended to cover all such modifications and changes as fall within the true spirit of the invention.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

The invention claimed is:

1. A quick disconnect system for an accessory electrically coupled to a component of an amusement attraction, the quick disconnect system comprising:
a multi-part electrical enclosure comprising a first side, a second side opposite the first side, a relief pass through having a first opening located on the first side, wherein the multi-part electrical enclosure is configured to:
have a first electrical cable coupled to the accessory pass into the multi-part electrical enclosure via the first opening of the relief pass through; and
have a second electrical cable pass into the second side of the multi-part electrical enclosure to enable the first and second cables to be coupled together within the multi-part electrical enclosure,
wherein the relief pass through is configured to provide strain relief to both the first electrical cable and the second electrical cable and to prevent inadvertent disconnection of the accessory from the multi-part electrical enclosure;
wherein the multi-part electrical enclosure comprises a first enclosure comprising a back wall, and a first wall extending away from the back wall, and a second opening located on the back wall for receiving the second electrical cable;
wherein the multi-part electrical enclosure comprises a second enclosure coupled to the first enclosure, the second enclosure comprising a second wall coupled to the first enclosure, wherein the first opening is located on the second enclosure;
wherein the multi-part electrical enclosure comprises a lid coupled to the second wall;
wherein the second enclosure comprises a first flange, and the multi-part electrical enclosure comprises a second flange disposed between the first enclosure and the second enclosure, and the second enclosure is coupled to the first enclosure via a plurality of fasteners disposed through the first and second flanges.

2. The quick disconnect system of claim 1, wherein the first opening is defined by the lid and the second wall and is located on an end of the second enclosure.

3. The quick disconnect system of claim 1, wherein the multi-part electrical enclosure comprises an additional strain relief pass through configured to provide strain relief for an additional cable coupled to an additional accessory.

4. The quick disconnect system of claim 1, wherein the lid is securely coupled to the second enclosure via one or more locking pins to prevent opening of the multi-part electrical enclosure.

5. The quick disconnect system of claim 4, comprising a release tool configured to be inserted into the lid to release the one or more locking pins to enable the lid to be removed from the second enclosure.

6. The quick disconnect system of claim 5, wherein lid is configured to be removed from the second enclosure by sliding it in a first direction.

7. The quick disconnect system of claim 1, wherein the lid is configured to be snapped onto to the second enclosure.

8. The quick disconnect system of claim 1, wherein the multi-part electrical enclosure is configured to maintain the first electrical cable at an angle relative to a direction of insertion of the first electrical cable into the second opening.

9. The quick disconnect system of claim 1, comprising the component, and the component comprises a ride vehicle or kiosk.

10. The quick disconnect system of claim 1, wherein the multi-part electrical enclosure comprises an electronics circuit board configured to provide a connection point for providing amplified signals or expanded in line capabilities.

11. A multi-part electrical enclosure for electrically coupling an accessory to an amusement attraction, the multi-part electrical enclosure comprising:
a first enclosure, comprising:
a back wall;
a first wall extending away from the back wall; and
a first opening positioned on the back wall and configured to receive a first electrical cable; and
a second enclosure, comprising:

a second wall coupled to the first enclosure;

a lid coupled to the second wall; and a relief pass through having a second opening defined by both the second wall and the lid, wherein the second opening is configured to receive a second electrical cable coupled to the accessory to enable the first and second cables to be coupled together within the multi-part electrical enclosure;

wherein, the lid is configured to be coupled to the second wall such that the relief pass through is configured to provide strain relief to the first and second electrical cables to prevent the accessory from being inadvertently disconnected from the multi-part electrical enclosure;

wherein the lid is securely coupled to the second enclosure via a fastener to prevent opening of the multi-part enclosure, wherein the fastener comprises one or more locking pins configured to be released via a release tool.

12. The multi-part electrical enclosure of claim 11, wherein the second enclosure comprises a first flange, and the multi-part electrical enclosure comprises a second flange disposed between the first enclosure and the second enclosure, and the second enclosure is coupled to the first enclosure via a plurality of fasteners disposed through the first and second flanges.

13. The multi-part electrical enclosure of claim 11, wherein the second enclosure is configured to maintain the second electrical cable at an angle relative to a direction of insertion of the first electrical cable into the second opening.

14. A method for rapidly changing an accessory on a component of an amusement attraction, the method comprising:

inserting a release tool into a lid of a multi-part electrical enclosure to release one or more locking pins securely coupling the lid to the multi-part electrical enclosure, wherein a first electrical cable coupled to the accessory passes into the multi-part electrical enclosure via a first opening of a relief pass through on a first side of the multi-part electrical enclosure and the first electrical cable is coupled together with a second electrical cable passing through a second opening on a second side of the multi-part electrical enclosure or a wireless adapter within the multi-part electrical enclosure, and wherein the relief pass through provides strain relief to at least the first electrical cable and prevents the accessory from being inadvertently disconnected from the multi-part electrical enclosure;

removing the lid from the multi-part electrical enclosure; and disconnecting the first electrical cable coupled to the accessory from the second electrical cable or the wireless adapter.

15. The method of claim 14, comprising:

coupling a third electrical cable coupled to another accessory to the second electrical cable or the wireless adapter; and securely coupling the lid to the multi-part electrical enclosure.

* * * * *